(12) United States Patent
Hatano et al.

(10) Patent No.: US 9,171,748 B2
(45) Date of Patent: Oct. 27, 2015

(54) CASSETTE ADAPTER, ADAPTER MAIN BODY LOCKING APPARATUS AND SEATING SENSOR MECHANISM

(75) Inventors: Takaichi Hatano, Toyohashi (JP); Shogo Saito, Toyohashi (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 994 days.

(21) Appl. No.: 13/233,295

(22) Filed: Sep. 15, 2011

(65) Prior Publication Data

US 2012/0067770 A1 Mar. 22, 2012

(30) Foreign Application Priority Data

Sep. 17, 2010 (JP) ................................. 2010-208847
Sep. 17, 2010 (JP) ................................. 2010-208848

(51) Int. Cl.
*H01L 21/673* (2006.01)
*H01L 21/677* (2006.01)

(52) U.S. Cl.
CPC .... *H01L 21/67379* (2013.01); *H01L 21/67775* (2013.01)

(58) Field of Classification Search
CPC ....... H01L 21/677; H01L 21/67005–21/67796
USPC ....................................................... 414/217
See application file for complete search history.

(56) References Cited

U.S. PATENT DOCUMENTS

2008/0063496 A1* 3/2008 Bufano et al. ........... 414/331.01

FOREIGN PATENT DOCUMENTS

| JP | 2003-504887 | * | 2/2003 | .............. H01L 21/68 |
| JP | 2006-332326 | * | 12/2006 | ............ H01L 21/677 |
| WO | WO 2006051577 A1 | * | 5/2006 | .............. H01L 21/68 |

* cited by examiner

*Primary Examiner* — Saul Rodgriguez
*Assistant Examiner* — Ashley Romano
(74) *Attorney, Agent, or Firm* — Oblon, McClelland, Maier & Neustadt, L.L.P.

(57) ABSTRACT

A cassette adapter which makes it possible for a second cassette which accommodates a circular wafer of a diameter of 200 mm to be used on a load port ready for a first cassette which accommodates a different circular wafer of another diameter of 300 mm is locked to the load port by an adapter main body locking apparatus. The locking apparatus includes a locking air cylinder serving as a locking member for locking the first cassette to a carrier base of the load port, and a locking target member provided integrally on a rear face of an adapter plate of the cassette adapter for disengageably engaging with a locking pawl at an end of a rod of the air cylinder. A seating sensor mechanism detects that the second cassette is seated at a correct position on the adapter plate.

10 Claims, 14 Drawing Sheets

CASSETTE ADAPTER, ADAPTER MAIN BODY LOCKING APPARATUS AND SEATING SENSOR MECHANISM

CROSS REFERENCE TO RELATED APPLICATION

This application claims priority to Japanese Application Numbers 2010-208847 and 2010-208848, both filed on Sep. 17, 2010, the entire contents of which are hereby incorporated by reference.

BACKGROUND OF THE INVENTION

1. Field of the Invention

This invention relates to a cassette adapter, an adapter main body locking apparatus and a seating sensor mechanism, and more particularly to a cassette adapter for making it possible for a load port ready for a 1st cassette which accommodates a wafer of 300 mm to receive thereon a 2nd cassette which accommodates another wafer of 200 mm. It is to be noted that, in the description herein, a "wafer of 300 mm" and a "wafer of 200 mm" signify circular wafers of a diameter of 300 mm and another diameter of 200 mm, respectively.

2. Description of the Related Art

In order to perform carrying a wafer into and out of a processing tool principally for processing a wafer of 300 mm, a load port for setting a 1st cassette which accommodates a plurality of wafers therein is attached to each of places on the outer side of the processing tool at which such carrying in and out of a wafer is performed.

In a processing tool principally for processing a wafer of 300 mm in this manner, it sometimes becomes necessary to perform processing of a wafer of 200 mm. In such an instance, there is no problem if each load port itself used on the outer side of the processing tool is replaced with a load port ready for the 2nd cassette which accommodates wafers of 200 mm. However, according to this countermeasure, in order to perform processing for wafers of 200 mm which are used less frequently than wafers of 300 mm, it is necessary to manufacture and prepare a large number of load ports for exclusive use ready for the 2nd cassette and replace the load ports themselves.

Further, according to the countermeasure described above, not only manufacture of load ports for exclusive use for the 2nd cassette which is used less frequently, but also an operation for the replacement of the load ports are required. This is very uneconomical, and also the processing efficiency of wafers is deteriorated by the replacement of the load ports.

Therefore, the inventor of the invention of the present patent application has perceived an idea of use of a cassette adapter for making it possible for a load port ready for a 1st cassette which can accommodate a wafer of 300 mm to receive thereon a 2nd cassette which accommodates another wafer of 200 mm. According to the idea, the cassette adapter is fixed firmly to a carrier table of a load port for a 1st cassette which accommodates a wafer of 300 mm. Besides, the entire 2nd cassette is accommodated in a cassette cover fixed to the carrier table, and an opening on this side of the cassette cover is covered with a plate member which configures the cassette adapter. Therefore, it is necessary to lock, during an operation of carrying a wafer into and out of a processing tool, the entire cassette adapter including the plate member which closes up the opening on this side of the cassette cover in which the 2nd cassette is accommodated to the carrier table.

Further, where the cassette adapter described above is applied, it is necessary to adopt a seating sensor mechanism for detecting both of a disposition position of an adapter main body supported for pivotal motion around a pivot shaft with respect to an adapter base which configures the cassette adapter and a seating position of the 2nd cassette on the adapter main body without modifying the load port side significantly.

It is to be noted that, in the concerned technical field, a 1st cassette which can accommodate a 1st wafer of 300 mm is called FOUP (Front Open Unified Pod), and a 2nd cassette which can accommodate a 2nd wafer of 200 mm is called open cassette.

Related apparatus are disclosed in Japanese Patent No. 4388505 and JP-T-2003-504887. However, the former related apparatus essentially requires an air cylinder for exclusive use for locking and opening and closing operations of a door itself while the latter related apparatus essentially requires use of a finger for preventing a cover from opening. Further, both related apparatus have a common problem that not a standard load port but a load port for exclusive use is required.

SUMMARY OF THE INVENTION

It is an object of the present invention to provide an adapter main body locking apparatus which can fix a cassette adapter, which makes it possible for a load port, which is ready for a 1st cassette which accommodates a wafer of 300 mm, to receive a 2nd cassette which accommodates a different wafer of 200 mm, to a carrier table to simultaneously lock a plate member, which configures the cassette adapter and closes up an opening on this side of a cassette cover, so that the plate member may not be opened in a state in which a 2nd cassette set on the cassette adapter is covered with the cassette cover.

It is another object of the present invention to provide a seating sensor mechanism which detects, when a cassette adapter is attached to a carrier table of a load port ready for a 1st cassette which accommodates a wafer of 300 mm therein and a 2nd cassette which accommodates a different wafer of 200 mm therein is set to the load port, that the 2nd cassette is seated at a correct position.

In order to attain the objects described above, according to an embodiment of the present invention, there is provided a cassette adapter adapted to be mounted on a load port that receives a first cassette to accommodate a first wafer of a first size therein. The cassette adapter includes an adapter base configured to be secured to the load port and an adapter body pivotally supported on the adapter base and configured to pivot around a pivot axis between a first position and a second position. The adapter body includes a first adapter plate on which a second cassette that accommodates a second wafer of a second size is placed when the adapter body is at the first position where the second wafer is approximately vertically positioned in the second cassette and a second adapter plate on which the second cassette is placed when the adapter body is at the second position where the second wafer is substantially horizontally positioned in the second cassette.

In the cassette adapter, the load port may have a locking member that releasably locks the first cassette thereon, and the adapter body may further include a locking target member provided on the second adapter plate and configured to be releasably locked by the locking member of the load port when the adapter body is at the second position.

In the cassette adapter, the load port may have a first sensor that detects when the first cassette is set in a correct position on the load port, and the adapter body may further include a sensor actuation member provided on the second adapter plate and configured to actuate the first sensor, the first sensor detecting when the adapter body is at the second position.

With the embodiment described above, the cassette adapter, which makes it possible for the load port, which is ready for the 1st cassette which accommodates a wafer of 300 mm, to receive the 2nd cassette which accommodates the different wafer of 200 mm, can be fixed to the carrier table to simultaneously lock the plate member, which configures the cassette adapter and closes up the opening on this side of the cassette cover, so that the plate member may not be opened in a state in which the 2nd cassette set on the cassette adapter is covered with the cassette cover. Therefore, such a defect that the 2nd cassette is displaced from a set position thereof by a hand of a person or the like during working of carrying in and out between the 2nd cassette and the processing tool can be prevented effectively.

With the embodiment, when the cassette adapter which makes it possible to set a 2nd cassette which accommodates a wafer of 200 mm to a load port ready for a 1st cassette which accommodates a wafer of 300 mm is mounted on the carrier table of the load port, it is detected with a high degree of accuracy that the 2nd cassette is disposed at a correct seating position of the cassette adapter. Consequently, the load port for the 1st cassette can be used to carry the 2nd wafer accommodated in the 2nd cassette into and out of a processing tool.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

Figure 1:
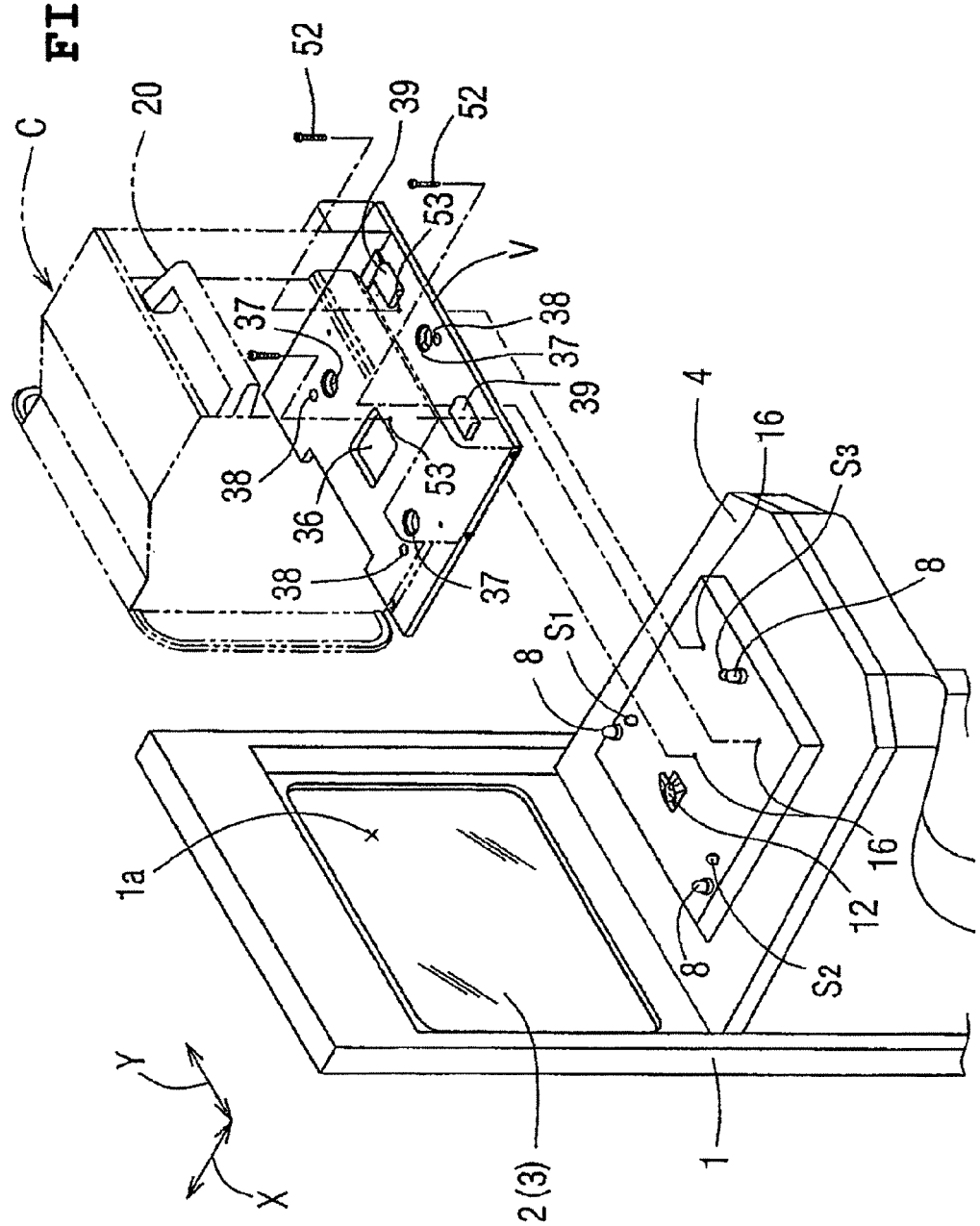
FIG. 1 is a perspective view illustrating a relationship of a fixation position of a cassette adapter to a carrier table of a cassette table of a load port.

In the following, the present invention is described in detail in connection with a preferred embodiment thereof. First, only those elements which are necessary for understandings of the present invention regarding a load port P which receives a 1st cassette $K_1$ which accommodates 1st wafers of 300 mm and carries a wafer of 300 mm into and from a processing tool 100 are described first with reference to FIGS. 1, 2, 14A and 14B, and then a cassette adapter A which includes a cassette cover C according to the present invention is described. The load port P includes a load port frame 1 disposed vertically in a state in which it contacts with an outer wall face at a particular position of a processing tool 100. The load port P further includes a door frame 3 disposed on the rear face side of the load port frame 1 and including a door plate 2 for holding a lid member not shown of the 1st cassette $K_1$ in order to removably hold the lid member. The load port P further includes a carrier deck 4 provided horizontally on this side of the load port frame 1 for setting a 1st cassette $K_1$ thereon. Though not shown, on this side of the door plate 2, a clamp pawl for locking and unlocking the lid member not shown of the 1st cassette $K_1$ and a suction cup for sucking the door plate 2 are provided. At a portion of the load port frame 1 above the carrier deck 4, a wafer transfer window 1a of a square shape for carrying a wafer into and out of the processing tool 100 therethrough is provided. A carrier table 5 is disposed for back and forth movement in a first horizontal direction X, in which a wafer is carried into and out of the processing tool 100, on the carrier deck 4. The carrier table 5 is adapted to set the 1st cassette $K_1$ in a state in which the 1st cassette $K_1$ is positioned in both of the first horizontal direction X and a second horizontal direction Y perpendicular to the first horizontal direction X. The carrier table 5 is covered in an overall area thereof with a table cover 6 and has three positioning pins 8 provided at positions thereof corresponding to three positioning holes 7 formed on a rear face of the 1st cassette $K_1$. The positioning holes 7 are formed on a lower face of projections 9 which are formed integrally on the rear face of the 1st cassette $K_1$ such that they project downwardly. Further, totaling three placement sensors (first sensors) $S_1$ to $S_3$ are provided in a projecting manner on an upper face of the carrier table 5 individually in the proximity of the positioning pins 8. If the 1st cassette $K_1$ is set or seated in the positioned state on the carrier table 5, then the placement sensors $S_1$ to $S_3$ are pushed to move downwardly by the projections 9 provided on the rear face of the 1st cassette $K_1$ thereby to detect that the 1st cassette $K_1$ is set or seated on the carrier table 5.

At a portion of the rear face of the 1st cassette $K_1$ proximate to the front face, that is, on the side adjacent the lid member, a clamp rib 11 having a mirrored L shape as viewed in side elevation is provided integrally. Meanwhile, on the carrier table 5, a clamp air cylinder 14 including a rod 13 having a clamp pawl 12 attached to an end thereof and engageable with the clamp rib 11 of the 1st cassette $K_1$ is disposed in an inclined relationship to a vertical line. The clamp pawl 12 is disposed such that it projects upwardly from an upper face of the carrier table 5 through a clamp hole 17 provided in the carrier table 5. The reason why the clamp air cylinder 14 is disposed in an inclined relationship as described above is that it is intended to assure a necessary length for movement of the rod 13 without interference with the bottom face of the 1st cassette $K_1$. When the rod 13 of the clamp air cylinder 14 performs back and forth movement and pivotal motion within a range of 90°, the clamp pawl 12 at the end of the rod 13 of the clamp air cylinder 14 and the clamp rib 11 of the 1st cassette $K_1$ are disengageably engaged with each other to set or seat the 1st cassette $K_1$ in a positioned state on the carrier table 5. Thus, the 1st cassette $K_1$ is locked in a state in which it is prevented from rising from the carrier table 5. If, in this state, the carrier table 5 moves forwardly toward the wafer transfer window 1a by driving means not shown, then a flange 15 (refer to FIG. 14A) provided on a peripheral edge of an opening on the front face of the 1st cassette $K_1$ set on the carrier table 5 is brought into close contact with a peripheral edge of the wafer transfer window 1a of the load port frame 1. Consequently, even if closing state of the wafer transfer window 1a of the load port frame 1 from the processing tool 100 side by the door plate 2 of the door frame 3 is canceled, the air-tightness of the wafer transfer window 1a is maintained and the air-tightness of the inside of the processing tool 100 which has a high degree of cleanness of air is maintained. Further, three threaded holes 16 are provided on the carrier table 5 for engaging with three knockout pins not shown. When the totaling three positioning pins 8 are utilized to set the 1st cassette $K_1$ on the upper face of the carrier table 5, if the position of the 1st cassette $K_1$ is displaced by a great amount from the normal position, then the knockout pins interfere with the bottom face of the 1st cassette $K_1$ thereby to notify a user of such displacement of the position of the 1st cassette $K_1$.

Now, the cassette adapter A according to the present invention is described with reference to FIGS. 1 to 11B. It is to be noted that, while various members are fixed to an adapter vertical plate B (first adapter plate) and an adapter horizontal plate E (second adapter plate) which configure an adapter main body D by bolts, since the fixation itself by bolts does not have any characteristic, in order to simplify illustration of the drawings to facilitate understandings of necessary features of the present invention, indication of bolts is omitted in all drawings except those bolts which are required in the present invention.

Referring first to FIGS. 4 to 7, the cassette adapter A includes an adapter base V in the form of a plate secured to the carrier table 5, and an adapter main body D formed from two plate members orthogonally integrated with each other in such a manner as to generally exhibit an L shape as viewed in side elevational and mounted for manual pivotal motion within an angle of 90°−θ around a pivot shaft 21. A pair of left and right damper plates 23 for supporting disk dampers 22 are secured to the opposite end portions of a rear end portion of the adapter base V along the first horizontal direction X. Further, a pair of shaft brackets 24 for supporting the pivot shaft 21 thereon are individually secured to the outer sides of the damper plates 23. The opposite end portions of the pivot shaft 21 extend through the damper plates 23 and the disk dampers 22 and supported by the shaft brackets 24. A shaft 25 is fitted integrally on the outer side of the pivot shaft 21 between the left and right damper plates 23. Consequently, the pivot shaft 21 and the shaft 25 rotate integrally with each other.

The adapter main body D includes an adapter vertical plate B on and from which a 2nd cassette $K_2$, which can accommodate a wafer of 200 mm therein, is to be placed and taken out in a state in which it is inclined by an angle θ (refer to FIG. 7) such that a portion thereof on the pivot shaft 21 side is positioned a little lower. The adapter main body D further includes an adapter horizontal plate E for changing, upon change of the posture of the adapter vertical plate B from the inclined posture to a horizontal posture, the posture of the 2nd cassette $K_2$ supported on the adapter vertical plate B by approximately 90° to a posture with which a wafer can be carried into and out of the processing tool 100 from and to the adapter vertical plate B thereby to re-place the 2nd cassette $K_2$. The adapter vertical plate B and the adapter horizontal plate E are attached integrally in an orthogonal relationship to each other to the shaft 25. A grip 20 is provided on the rear face of the adapter vertical plate B. The grip 20 can be grasped by a hand of an operator when the adapter main body D formed from two plate members integrated in an orthogonal relationship with each other in such a manner as to exhibit an L shape as viewed in side elevation is to be pivoted by a manual operation.

Figure 12:
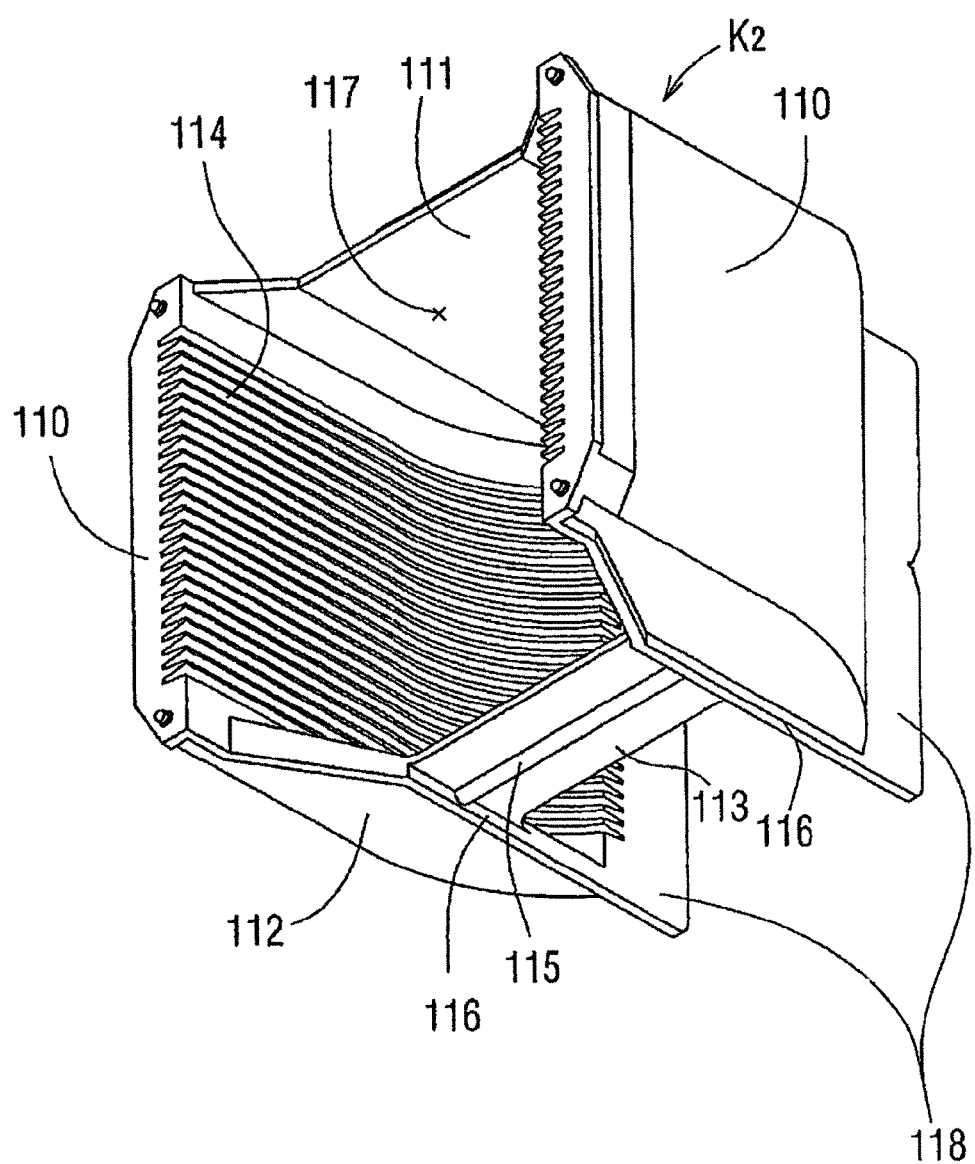
FIG. 12 is a perspective view showing the 2nd cassette as viewed from the lower side.

Positioning guides $F_1$ and $F_2$ capable of positioning and supporting the 2nd cassette $K_2$ in different postures are attached to inner faces of the adapter vertical plate B and the adapter horizontal plate E, respectively. The positioning guides $F_1$ and $F_2$ comply with the shape of the 2nd cassette $K_2$. Accordingly, the shape of the 2nd cassette $K_2$ in a relationship to the positioning guides $F_1$ and $F_2$ is described briefly with reference to FIGS. 3, 12, and 13. The 2nd cassette $K_2$ for accommodating wafers of 200 mm includes a pair of cassette frames 110 connected to each other by an upper plate 111, a lower plate 112 and a bottom plate 113. A large number of wafer insertion grooves 114 each for receiving and supporting a circumferential edge portion of a wafer are formed at a fixed pitch on an inner side face of each of the cassette frames 110 so as to extend in an upward and downward direction. Further, a positioning bar 115 is provided along an opposing direction of the cassette frames 110 on a lower face of the bottom plate 113. A pair of sensor ribs 116 are formed in parallel to each other at the opposite ends of the positioning bar 115 and extend orthogonally to the positioning bar 115 such that they project a little from the positioning bar 115. Meanwhile, another pair of sensor ribs 116 are formed in parallel to each other and orthogonally to the sensor ribs 116 on the opposite sides to a wafer insertion opening 117 such that a wafer inserted can be supported vertically. Further, a handle 119 (refer to FIG. 6) for carrying the 2nd cassette $K_2$ by a hand is provided on the upper plate 111.

Figure 3:
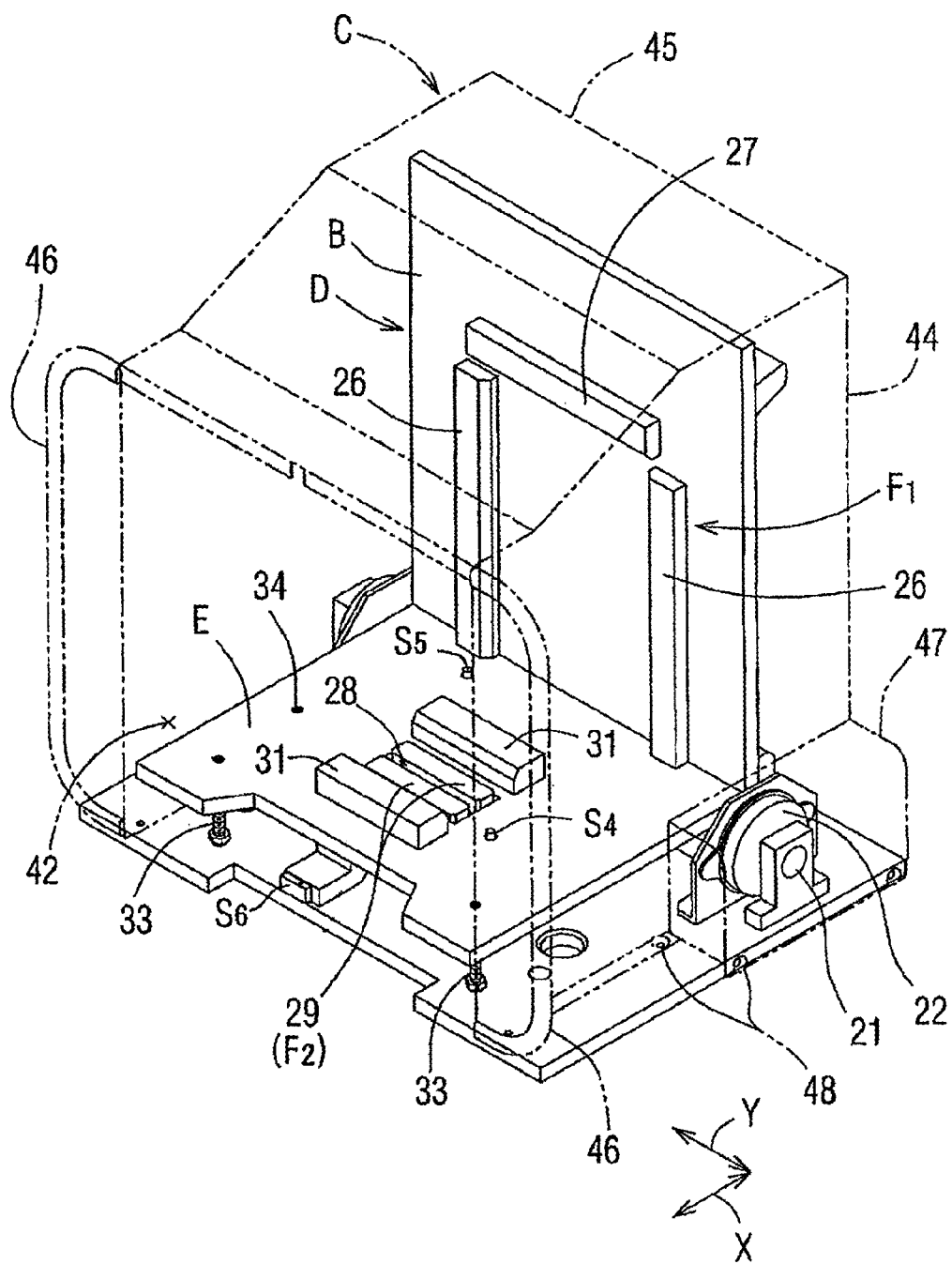
FIG. 3 is a perspective view of the cassette adapter.
Figure 13:
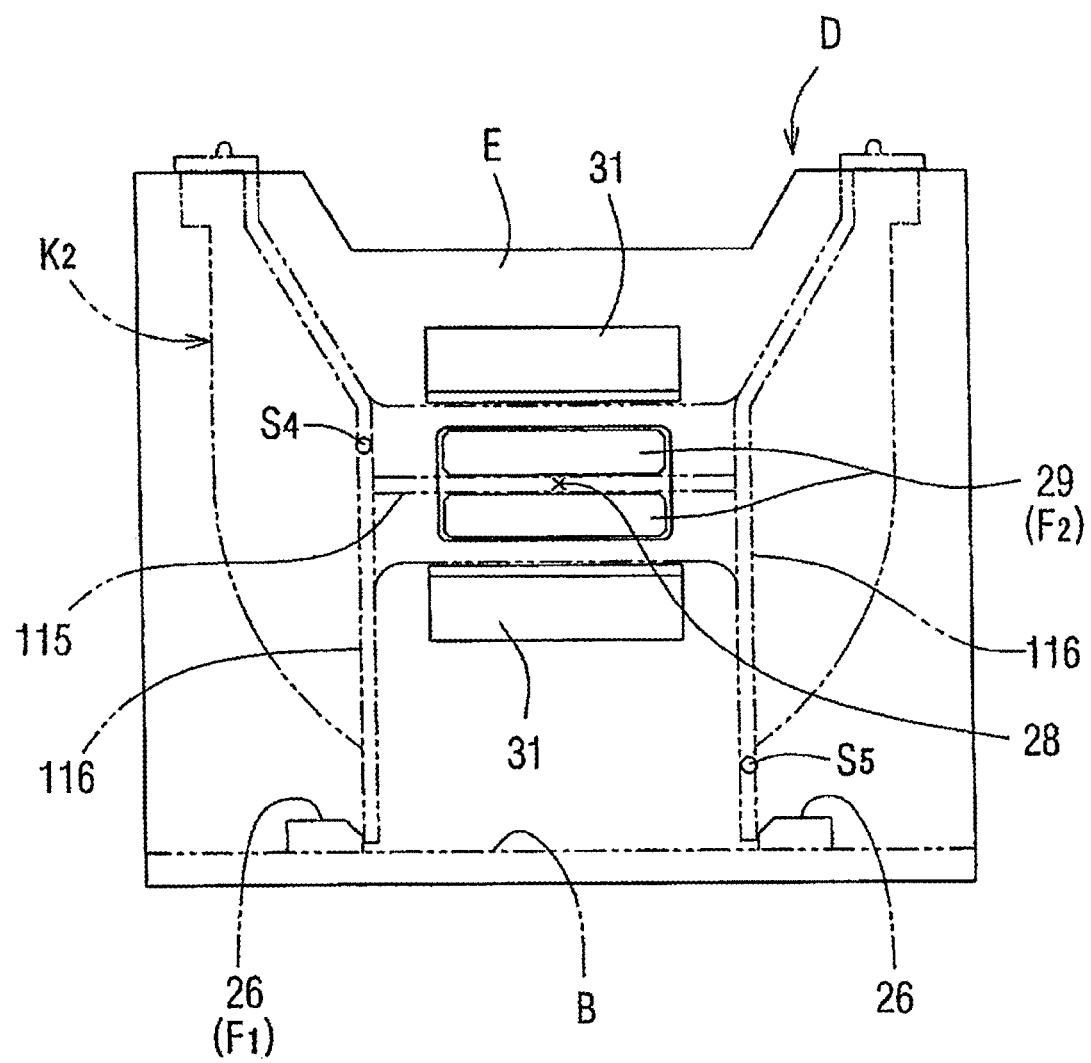
FIG. 13 is a schematic view illustrating a relationship between positioning guides provided on the adapter main body and ribs serving as positioning target portions of the 2nd cassette.
Figure 14A:
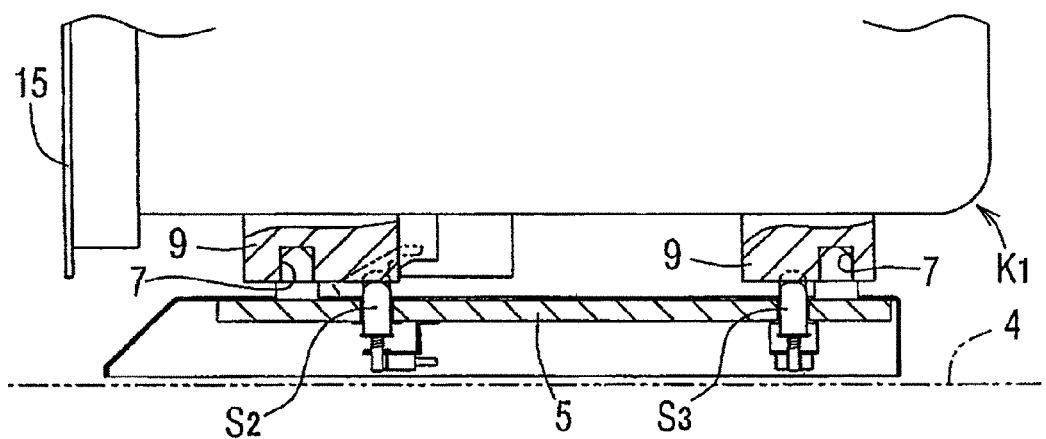
FIGS. 14A and 14B are sectional views taken along different planes of the 1st cassette set on the carrier table of the load port.
Figure 14B:
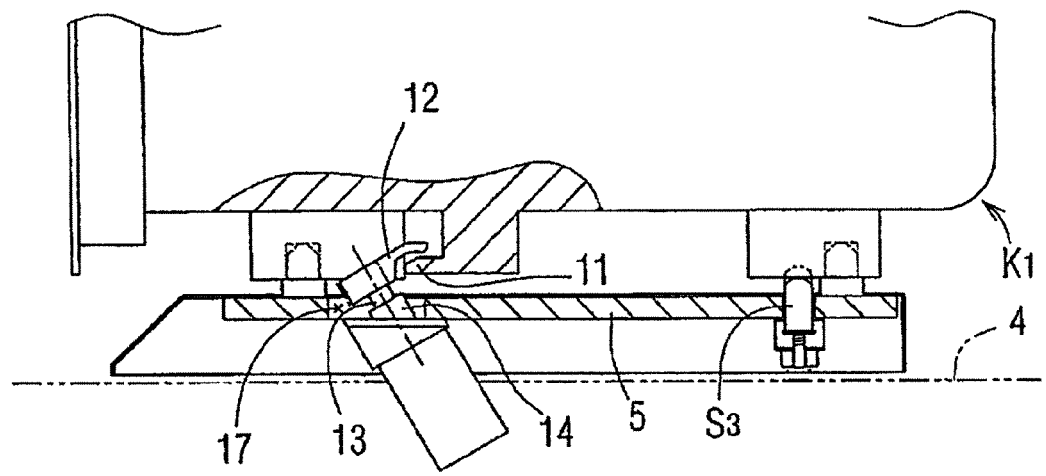

Further, the positioning guides $F_1$ and $F_2$ are provided on the adapter vertical plate B and the adapter horizontal plate E, respectively, so that the 2nd cassette $K_2$ can be positioned and set on both of the adapter vertical plate B disposed in an inclined relationship such that a portion thereof on the pivot shaft 21 side is positioned a little lower and the adapter horizontal plate E disposed horizontally. The positioning guide $F_1$ provided on the adapter vertical plate B includes a pair of positioning guides 26 each in the form of an elongated block for restraining the position of a pair of upright plates 118 of the 2nd cassette $K_2$ from the outer sides. The positioning guide $F_1$ further includes a positioning guide 27 in the form of an elongated block for restraining end faces of the upright plates 118 remote from the adapter horizontal plate E in a state in which the sensor ribs 116 of the 2nd cassette $K_2$ contact with an upper face of the adapter horizontal plate E. Meanwhile, the positioning guide $F_2$ includes a pair of positioning guides 29 each in the form of an elongated block for forming a positioning insertion groove 28 into which the positioning bar 115 of the 2nd cassette $K_2$ is to be inserted in a state in which the 2nd cassette $K_2$ is positioned with respect to the adapter vertical plate B by the positioning guide $F_1$ in such a manner as described above. Consequently, if the 2nd cassette $K_2$ in which wafers accommodated therein keep a substantially vertical posture is placed on the adapter vertical plate B disposed such that a portion thereof on the pivot shaft 21 side is positioned a little lower and then is slidably moved a little in this state toward the adapter horizontal plate E side, then the paired upright plates 118 of the 2nd cassette $K_2$ are fitted between the paired positioning guides 26 and the positioning guide 27 of the adapter vertical plate B. Further, the positioning bar 115 of the 2nd cassette $K_2$ is inserted into the positioning insertion groove 28 between the paired positioning guides 29. Consequently, the 2nd cassette $K_2$ is positioned with respect to both of the adapter vertical plate B and the adapter horizontal plate E. Therefore, even if the adapter main body D is pivoted by 90°−θ to place the adapter horizontal plate E into a horizontal state while it is placed on the 2nd cassette $K_2$ on the adapter vertical plate B, the 2nd cassette $K_2$ pivoted substantially by 90° keeps the position in which it is positioned in both of the first and second horizontal directions X and Y with respect to the adapter horizontal plate E. It is to be noted that, as seen in FIGS. 3, 13 and so forth, a pair of guiding and restraining members 31 are provided which are disposed in parallel to and on the outer sides of the paired positioning guides 29 and have a thickness greater than that of the positioning guides 29. The guiding and restraining members 31 position and guide the 2nd cassette $K_2$ with respect to the positioning guide $F_2$ and prevent the 2nd cassette $K_2$ from moving in the first horizontal direction X in the state in which the 2nd cassette $K_2$ is positioned.

Figure 4:
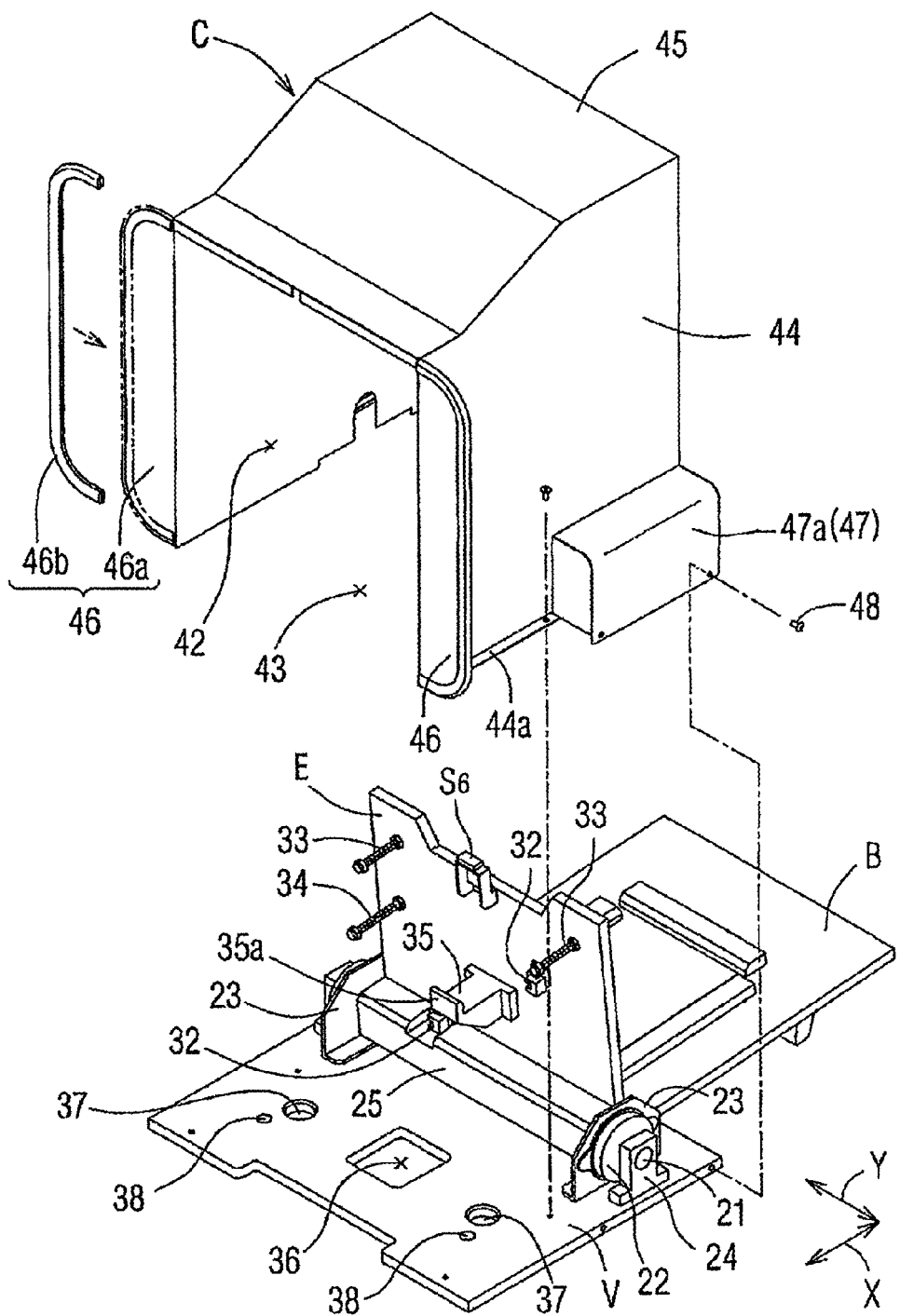
FIG. 4 is a perspective view showing the cassette adapter separate from a cassette cover.
Figure 5:
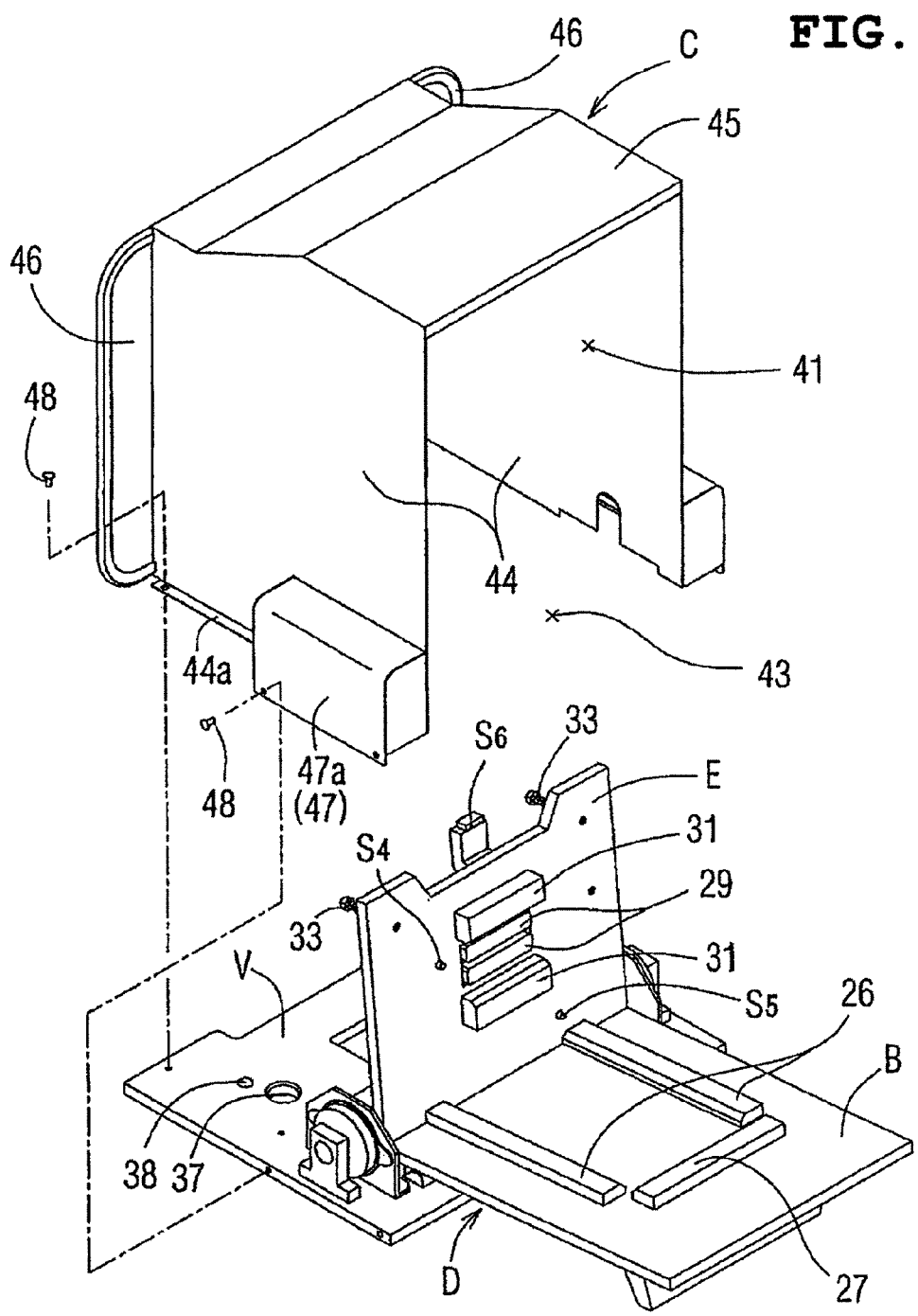
FIG. 5 is a perspective view showing the cassette adapter separate from the cassette cover but as viewed in a different direction from that of FIG. 4.
Figure 8:
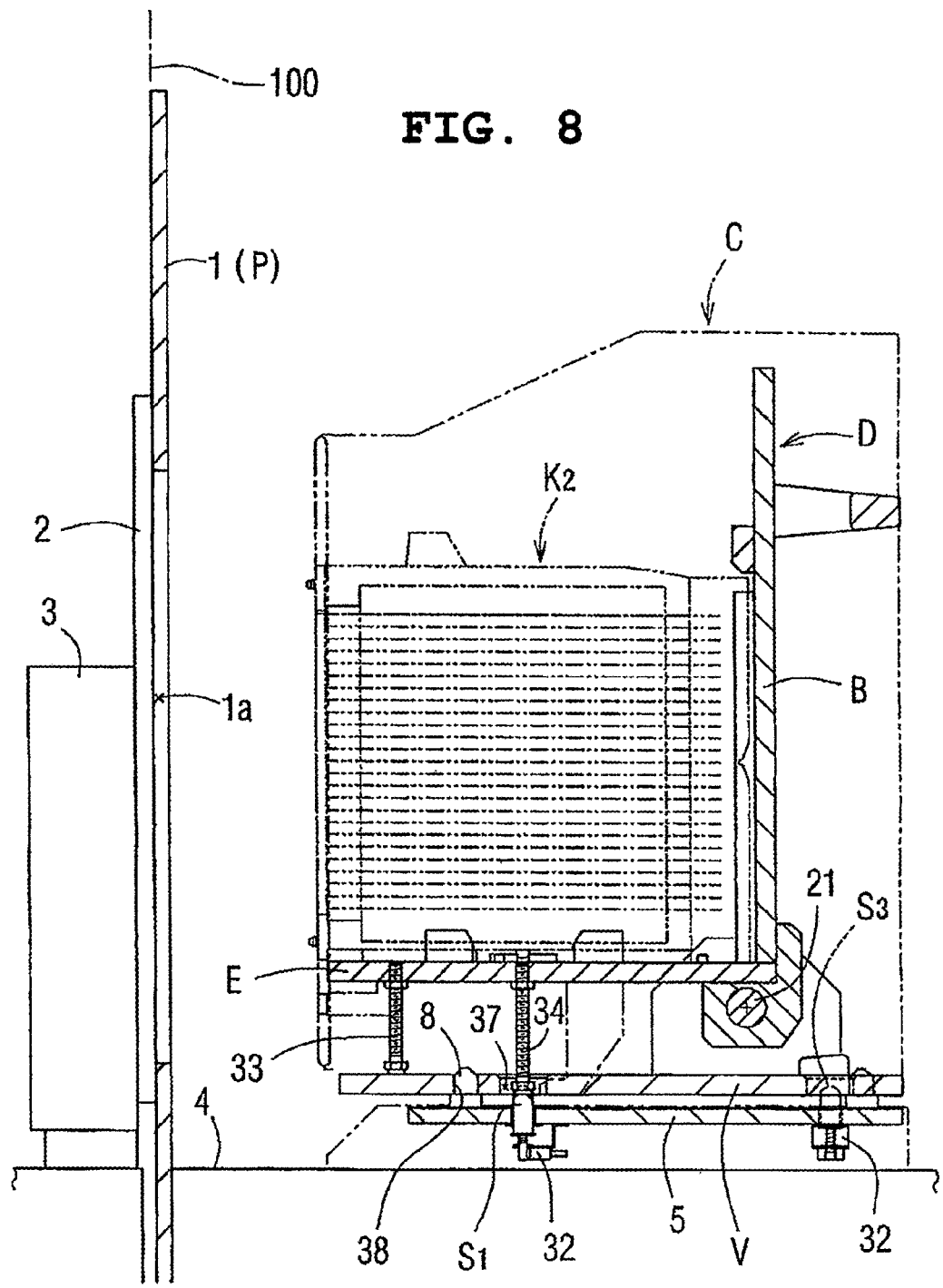
FIG. 8 is a side elevational sectional view showing the adapter main body placed on an adapter base by pivoting motion of the adapter main body by 90°−θ in a state in which the 2nd cassette is received by the cassette receiving table.
Figure 9:
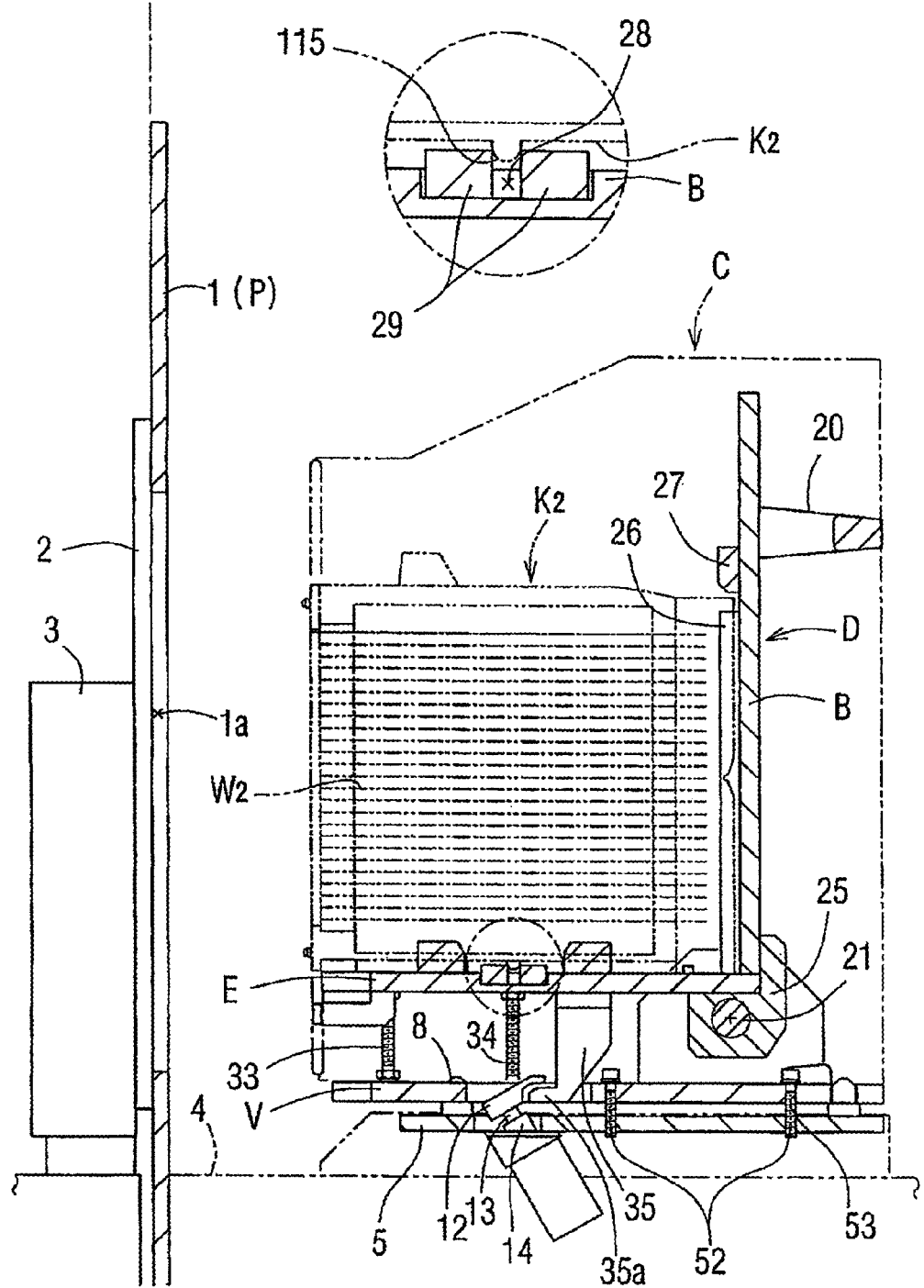
FIG. 9 is a side elevational sectional view principally showing the adapter main body locked to the carrier table in a state similar to that in FIG. 8.
Figure 10A:
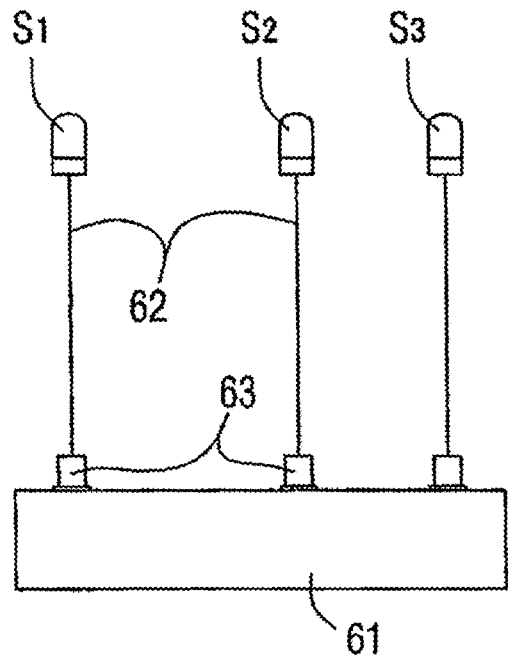
FIGS. 10A and 10B are schematic views showing seating sensors in valid and invalid states in cases in which 1st and 2nd cassettes are set to the carrier table, respectively.
Figure 10B:
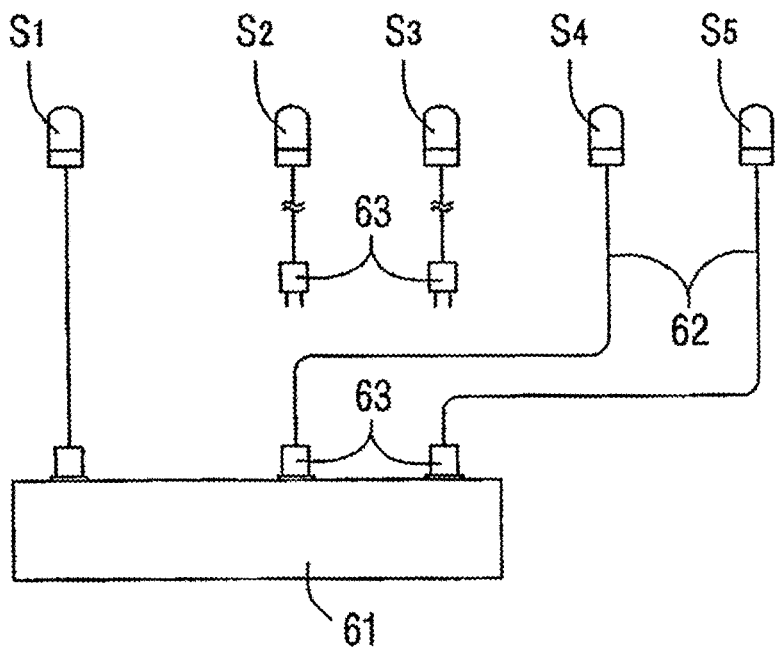
Figure 11A:
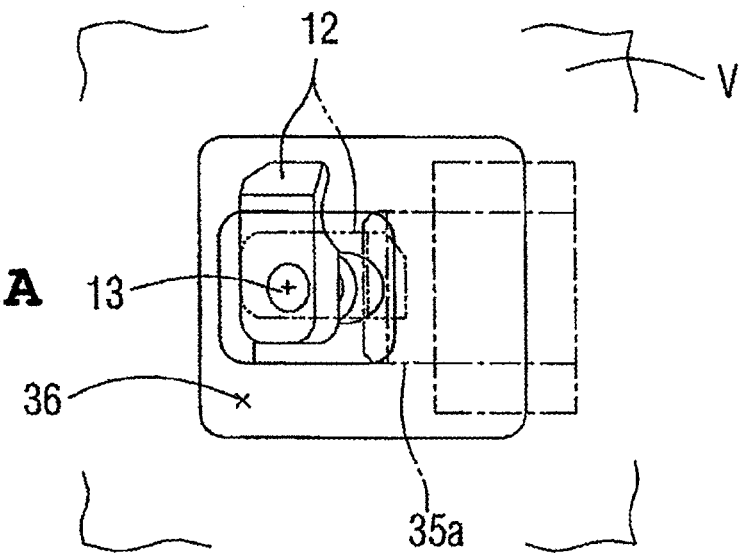
FIGS. 11A and 11B are a plan view and a side elevational sectional view, respectively, illustrating a relationship between a clamp pawl of a clamp air cylinder and a clamp bracket attached to a rear face of an adapter plate in a locking state and a non-locking state.
Figure 11B:
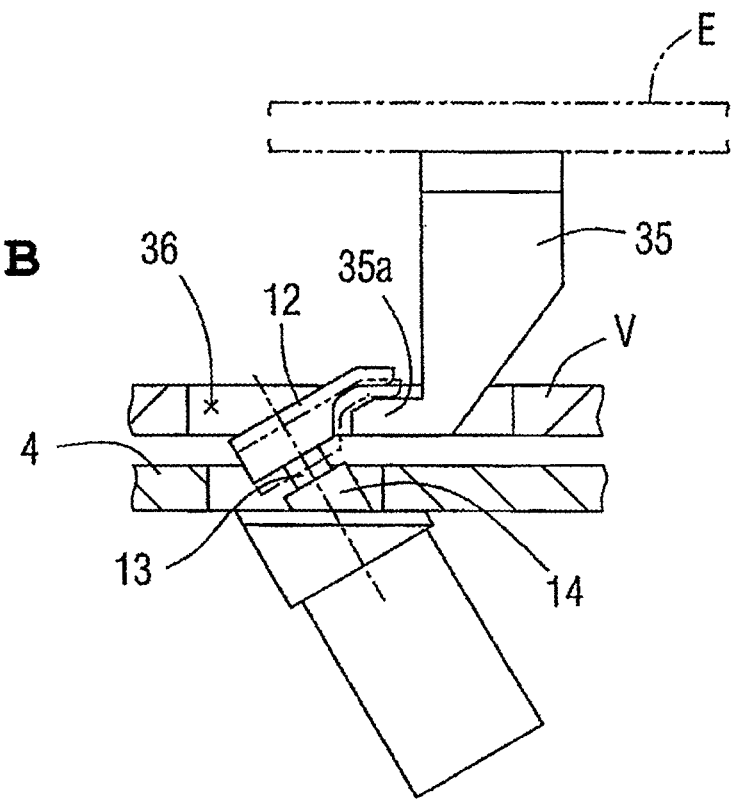

Also with regard to the 2nd cassette $K_2$, it is necessary to detect that it is set or seated in a correct parallel posture on the adapter horizontal plate E. Thus, cassette placement sensors (second sensors) $S_4$ and $S_5$ are disposed along one of diagonal lines of the adapter horizontal plate E for projecting and retreating movement. The cassette placement sensors $S_4$ and $S_5$ are abutted by a rear face of the lower plate 112 of the 2nd cassette $K_2$ in a state in which the 2nd cassette $K_2$ is positioned and set on the adapter horizontal plate E by the positioning guide $F_2$ as seen in FIGS. 3 and 4 to detect the horizontal posture of the 2nd cassette $K_2$. The cassette placement sensors $S_4$ and $S_5$ are actuated by the sensor ribs 116 when the 2nd cassette $K_2$ is positioned and set on the adapter horizontal plate E. It is to be noted that each of the cassette placement sensors $S_4$ and $S_5$ is supported for projecting and retreating movement by a sensor holder 32. Even if the 2nd cassette $K_2$ is placed correctly horizontally on the adapter horizontal plate E which configures the adapter main body D and both of the cassette placement sensors $S_4$ and $S_5$ are actuated, if the adapter horizontal plate E is not placed horizontally, then the 2nd cassette $K_2$ placed on the adapter horizontal plate E is placed but not horizontally. In this instance, a trouble occurs when it is tried to take out a wafer from the 2nd cassette $K_2$ before processing or to accommodate the wafer into the 2nd cassette $K_2$ after the processing. Therefore, a pair of left and right stopper bolts 33 for contacting with the adapter base V in a state in which the adapter horizontal plate E lies horizontally are provided at portions of the rear face of the adapter horizontal plate E in the proximity of the opposite corner portions on the free end side. Further, a sensor bolt 34 for actuating the placement sensor $S_1$ disposed below the adapter base V in the state in which the adapter base V lies horizontally is attached to a position of the rear face of the adapter horizontal plate E corresponding to the disposition position of the placement sensor $S_1$. The configurations just described make it possible to detect both of the fact that the 2nd cassette $K_2$ is placed correctly horizontally on the adapter horizontal plate E and the fact that the adapter horizontal plate E is placed horizontally. Further, a clamp bracket 35 having an L shape elongated in the upward and downward direction similarly is attached to a position of the rear face of the adapter horizontal plate E corresponding to the clamp rib 11 provided on the 1st cassette $K_1$ in the state in which the adapter horizontal plate E is disposed horizontally. A clamp bracket 35a at an end of the clamp bracket 35 and the clamp pawl 12 at an end of the rod 13 of the clamp air cylinder 14 are engaged with each other to lock the adapter main body D to the carrier table 5 as shown in FIGS. 9, 11A and 11B. It is to be noted that, in FIGS. 4 and 8, a clamp hole 36 for preventing otherwise possible interference of the clamp pawl 12 at the end of the rod 13 of the clamp air cylinder 14 and the clamp bracket 35 with the adapter base V and a positioning hole 37 provided in the adapter base V for preventing otherwise possible interference of the placement sensors $S_1$ to $S_3$ provided on the carrier table 5 with the adapter base V are shown.

Totaling three positioning holes 38 for accepting the totaling three positioning pins 8 provided on the carrier table 5 of the load port P for the 1st cassette $K_1$ to position and set the adapter base V on the carrier table 5 are provided in the adapter base V.

Now, the cassette cover C attached to the adapter base V in order to accommodate both of the adapter main body D and the 2nd cassette $K_2$ in a state in which the 2nd cassette $K_2$ is set on the adapter horizontal plate E of the adapter main body D is described with reference to FIGS. 2 to 5. The 2nd cassette $K_2$ is only placed on the adapter horizontal plate E of the adapter main body D in a state in which it is positioned in the first and second horizontal directions X and Y but not in a locked state. Therefore, when a 2nd wafer $W_2$ is carried into and out of the processing tool 100, or in other words, during, before and after actuation of a wafer transferring robot disposed in the processing tool 100, the 2nd cassette $K_2$ is entirely covered with the cassette cover C in order to protect the 2nd cassette $K_2$ placed in a positioned state on the adapter horizontal plate E from being touched by any other member therearound. The cassette cover C is formed from a transparent resin material so that the inside thereof can be visually observed. The 2nd cassette $K_2$ is open at three faces thereof including this side face, the interior side face and the bottom face as viewed from an operator who operates the 2nd cassette $K_2$ to form a rear opening 41, a front opening 42 and a bottom opening 43, respectively, and generally has a cubic shape. A pair of flanges 46 are formed at end edge faces of the opposite side plates 44 of the cassette cover C such that they integrally extend outwardly sidewardly in flush with an end edge face of a top plate 45. Consequently, in a state in which the 2nd cassette $K_2$ is advanced to an advancement end position and positioned at the carrying in and out position for a 2nd wafer, the flanges 46 contact with the peripheral edge of the wafer transfer window 1a of the load port P to close up the wafer transfer window 1a. The flanges 46 are configured such that a frange edge 46b is fitted with a peripheral edge portion of a flange plate 46a and the left and right flanges 46 contact with the opposite side edge portions of the wafer transfer window 1a. Further, at a substantially half portion on this side of a lower end portion of each of the side plates 44, a damper cover 47 for covering a disk damper 22 secured to the adapter base V and damper plate 23 and shaft bracket 24 for supporting a damper and a shaft is provided in a sidewardly projecting manner. The top plate 45 is formed in a stepped state such that this side thereof is positioned higher so that the adapter vertical plate B in an uprightly erected state can be accommodated therebelow. The cassette cover C is removably attached to the adapter base V in the following manner. In particular, bottom flanges 44a provided horizontally outwardly at a lower end of a side plate 44 and a damper cover 47a of the damper cover 47 are removably attached to an upper face peripheral edge portion and side end faces of the adapter base V using a plurality of screws 48, respectively.

Figure 6:
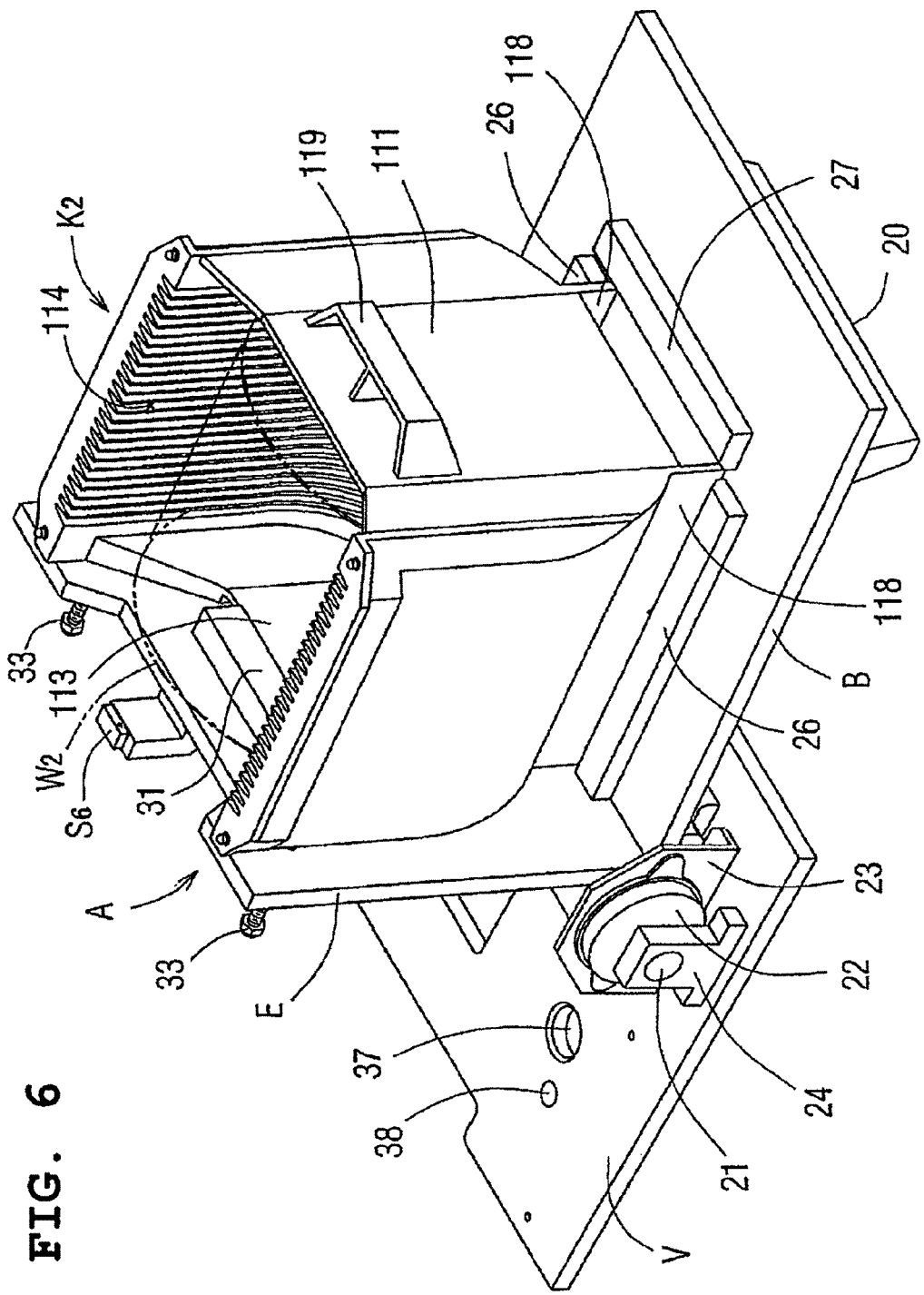
FIGS. 6 and 7 are a perspective view and a side elevational view, respectively, showing a 2nd cassette received by a cassette adapter vertical plate with an adapter main body tilted down to this side.
Figure 7:
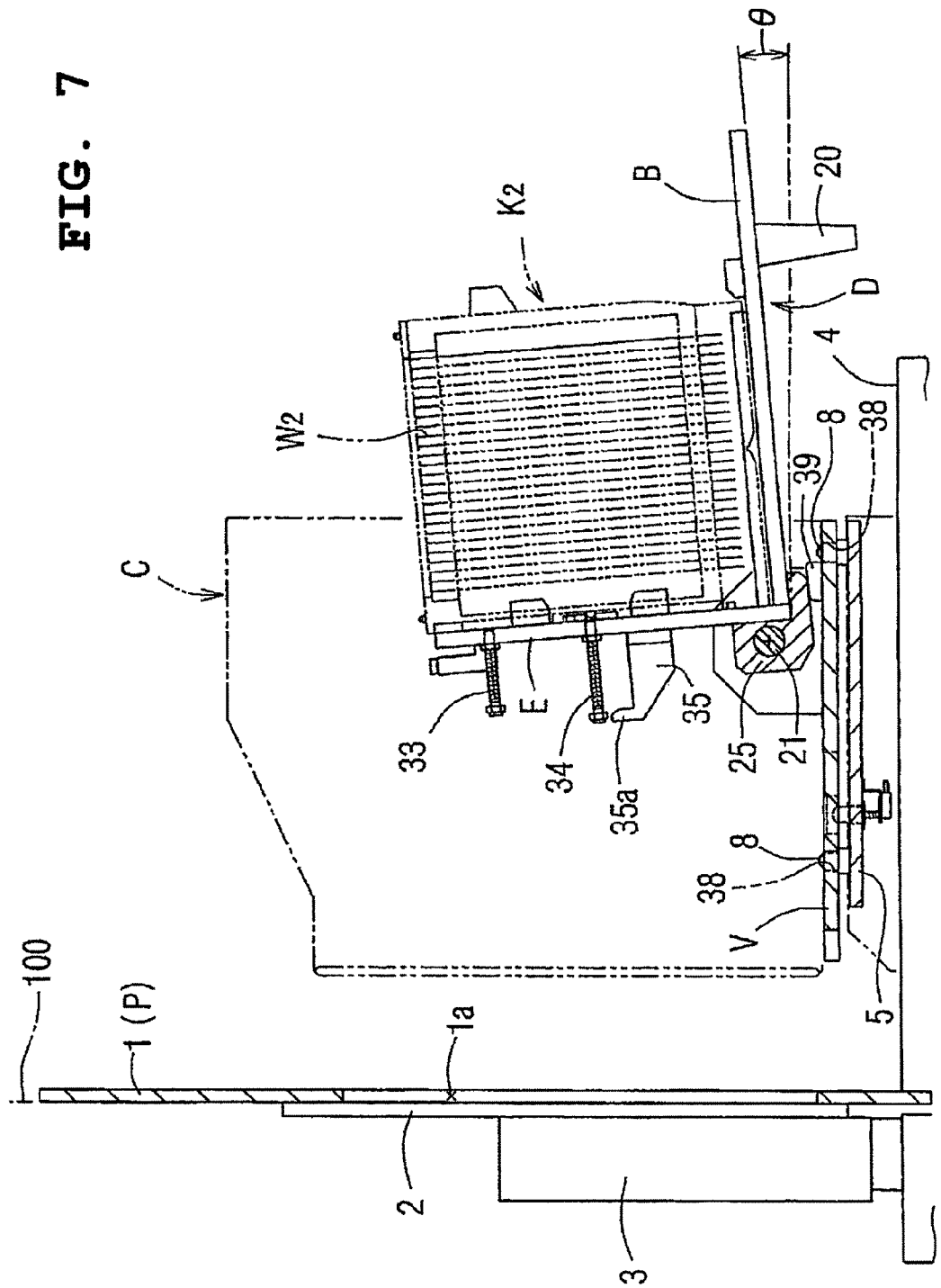

Further, a pair of left and right stoppers 39 for being abutted by the shaft 25 fitted on the outer side of the pivot shaft 21 are attached to the adapter base V as shown in FIGS. 6 and 7. More particularly, the stoppers 39 are attached to a portion of the adapter base V at which the pivot shaft 21 is disposed in order that, when the 2nd cassette $K_2$ in which 2nd wafers $W_2$ are accommodated substantially vertically is to be set to the adapter vertical plate B, the adapter vertical plate B is disposed in an inclined relationship such that the portion thereof on the pivot shaft 21 side is positioned a little lower. The inclination angle θ of the adapter vertical plate B is 5 to 10°. It is to be noted that, in FIGS. 3 to 5, a wafer protrusion sensor $S_6$ is shown which is one of paired wafer protrusion sensors for detecting a 2nd wafer $W_2$ projecting by more than a fixed amount from a 2nd cassette $K_2$ upon starting of carrying out or taking out of a 2nd wafer $W_2$ from within the 2nd cassette $K_2$. The wafer protrusion sensor $S_6$ is attached in projecting state on the rear face of a central portion of an end portion of the adapter horizontal plate E through a bracket.

Figure 2:
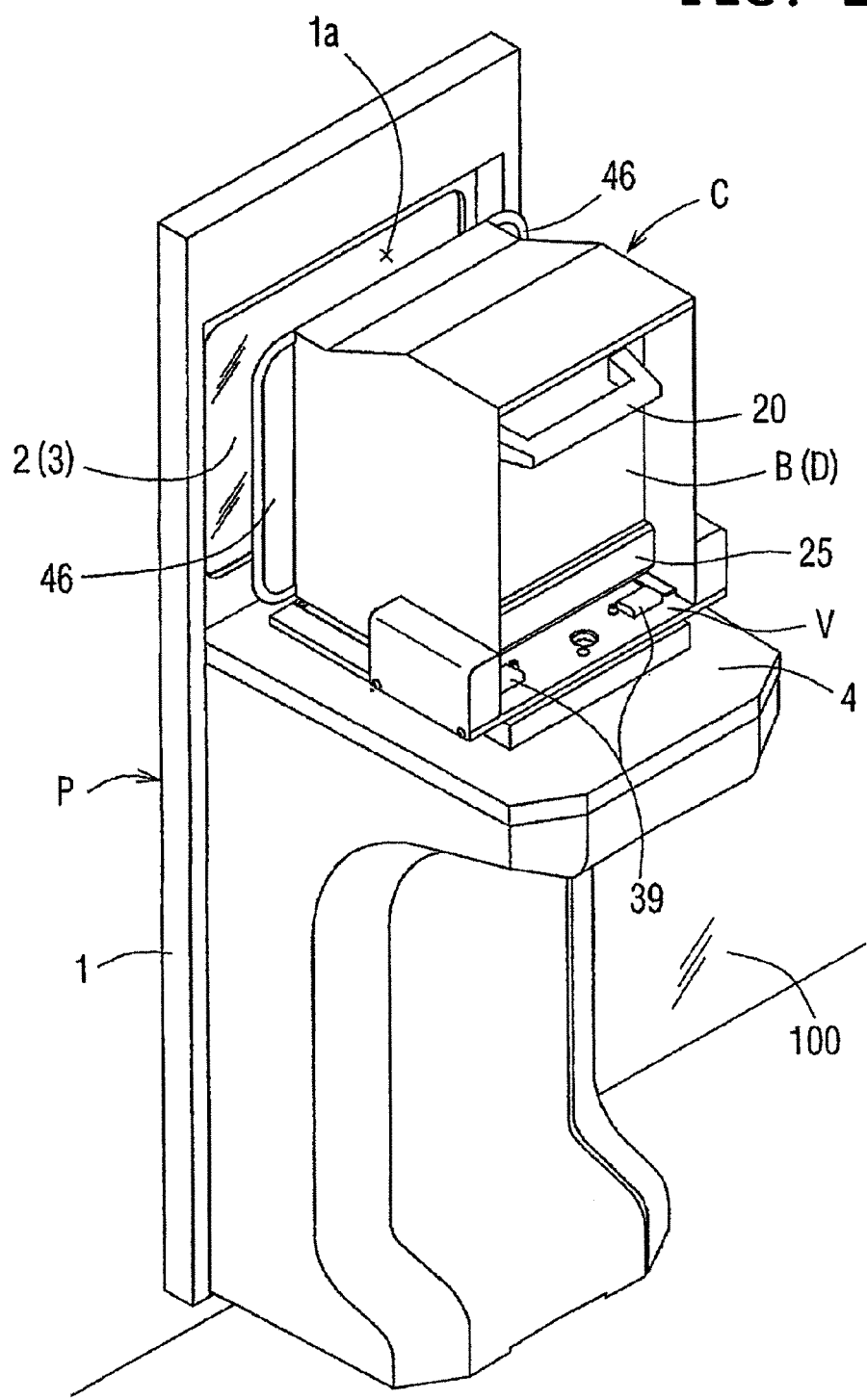
FIG. 2 is a perspective view showing the cassette adapter fixed to the carrier table.

When the cassette adapter A is to be attached to the carrier table 5 of the load port P for the 1st cassette $K_1$, the adapter base V in a state in which the cassette cover C is not attached thereto is secured to the carrier table 5 using a plurality of threaded holes 16 for lockout pins not shown formed on the carrier table 5 and a number of fixing bolts 52 equal to the number of the threaded holes 16 as seen in FIG. 1. A bolt insertion hole 53 shown in FIGS. 1 and 9 is fitted through a portion of the adapter base V corresponding to each of the threaded holes 16. The adapter base V is secured to the carrier table 5 in a state in which the adapter base V is positioned in the first and second horizontal directions X and Y with respect to the carrier table 5 in the following manner. In particular, the adapter base V of the cassette adapter A is disposed directly above the carrier table 5 and moved downwardly until the positioning pins 8 provided on the carrier table 5 are fitted into the respective positioning holes 38 for the positioning pins 8. In this state, the fixing bolts 52 fitted in the bolt insertion holes 53 of the adapter base V are screwed into the respective threaded holes 16 of the carrier table 5 thereby to secure the adapter base V to the carrier table 5 (refer to FIG. 9). Consequently, the adapter main body D which configures the cassette adapter A is mounted on the carrier table 5 of the load port P for the 1st cassette $K_1$ such that it can pivot by an angle of 90°−θ around the pivot shaft 21. If the cassette cover C is attached to the adapter base V using a plurality of screws 48, then the entire adapter main body D is covered with the cassette cover C in a state in which the adapter vertical plate B assumes a vertical posture as seen in FIG. 2.

Now, operation when, after a 2nd cassette $K_2$ in which 2nd wafers $W_2$ are accommodated is set to the adapter vertical plate B disposed in an inclined state, the adapter main body D is pivoted by 90°−θ until the adapter horizontal plate E of the adapter main body D is locked to the carrier table 5 of the load port P in a state in which the adapter main body D is entirely covered with the cassette cover C is described with reference to FIGS. 6 to 11B. In order to mount the cassette adapter A on the carrier table 5 of the load port P for the 1st cassette $K_1$ to use the cassette adapter A for making it possible to set the 2nd cassette $K_2$, only the placement sensor $S_1$ from among the placement sensors $S_1$ to $S_3$ provided on the carrier table 5 of the load port P is rendered effective while the remaining placement sensors $S_2$ and $S_3$ are rendered ineffective. Further, the cassette placement sensors $S_4$ and $S_5$ attached to the adapter horizontal plate E of the cassette adapter A are rendered effective (refer to FIGS. 10A and 10B). It is to be noted that, in FIGS. 10A and 10B, a console 61 for controlling actuation of the cassette adapter A, and cables 62 and connectors 63 for the placement sensors $S_1$ to $S_3$ and the cassette sensors $S_4$ and $S_5$ are shown.

First, if the adapter main body D is manually tilted down to this side as seen in FIGS. 6 and 7, then the brackets on the opposite ends of the shaft 25 are abutted with the paired left and right stoppers 39 attached to the adapter base V to dispose the adapter vertical plate B of the adapter main body D in an inclined relationship by the angle θ with respect to the horizontal plane such that the portion thereof on the pivot shaft 21 side is positioned lower. When the adapter main body D is pivotally moved by a manual operation in this manner, since the disk dampers 22 disposed on the opposite end portions of the pivot shaft 21 provide resistance to the pivotal motion, the adapter main body D is prevented from being pivotally moved at a high speed by the weight of the adapter main body D itself but pivotally moves slowly. Therefore, when the pivotal motion of the adapter main body D stops, the 2nd wafers $W_2$ supported on the 2nd cassettes $K_2$ are prevented from projecting from the wafer insertion grooves 114. In this state, if the paired left and right upright plates 118 of the 2nd cassette $K_2$ with the accommodated 2nd wafers $W_2$ directed substantially vertically are inserted between the paired left and right positioning guides 26 and the positioning guide 27 which configure the positioning guide $F_1$, then since the adapter vertical plate B is disposed in an inclined relationship, the 2nd cassette $K_2$ is pressed toward the adapter horizontal plate E in the uprightly erected posture. Consequently, the positioning bar 115 provided on the rear face of the bottom plate 113 is inserted into the positioning insertion groove 28 formed between the two positioning guides 29 which configure the positioning guide $F_2$. Consequently, in a state in which the adapter main body D is pivoted by 90°−θ and the substantially inverted 2nd cassette $K_2$ is placed on the adapter horizontal plate E as seen in FIGS. 8 and 9, the 2nd cassette $K_2$ is positioned in the first and second horizontal directions X and Y.

By the pivotal motion of the adapter main body D by 90°−θ, both of the cassette placement sensors $S_4$ and $S_5$ provided on the adapter horizontal plate E are placed into an ON state by the sensor ribs 116 of the 2nd cassette $K_2$ transferred to the adapter horizontal plate E disposed horizontally from the adapter vertical plate B disposed in an inclined relationship. Consequently, it is detected that the 2nd cassette $K_2$ is set or seated in a correct posture on the adapter horizontal plate E. Further, by the pivotal motion of the adapter main body D by 90°−θ, the paired left and right stopper bolts 33 provided on the rear face of the adapter horizontal plate E are brought into abutment with the adapter base V to dispose the adapter horizontal plate E horizontally. Consequently, the sensor bolts 34 attached to the rear face of the adapter horizontal plate E places the placement sensor $S_1$ attached to the carrier table 5 into an ON state through the positioning hole 37 of the adapter horizontal plate E. Consequently, it is detected that the adapter horizontal plate E is disposed horizontally.

That the placement sensor $S_1$ and the cassette placement sensors $S_4$ and $S_5$ are all placed into an ON state in this manner signifies that both of the facts that the 2nd cassette $K_2$ is seated in a correct posture on the adapter horizontal plate E and that the adapter horizontal plate E is disposed horizontally are confirmed and further signifies that the 2nd cassette $K_2$ is seated at a correct position on the upper face of the horizontally disposed adapter horizontal plate E. Further, since the positions of the paired left and right stopper bolts 33 are selected so as to be farthest from the pivot shaft 21 of the adapter main body D and the sensor bolt 34 is selectively positioned at that one $S_1$ of the placement sensors $S_1$ and $S_2$ spaced by a great distance from the pivot shaft 21, the accuracy in horizontal disposition of the adapter horizontal plate E is enhanced.

Thereafter, if the rod 13 of the clamp air cylinder 14 is projected to a projecting end position thereof and then the rod 13 is retracted after it is rotated by 90° in a state in which the clamp pawl 12 at the end of the rod 13 is disposed along the second horizontal direction Y as shown in FIG. 11A, then the clamp bracket 35a of the clamp bracket 35 on the reverse face of the adapter horizontal plate E entering in the positioning hole 37 of the adapter base V is locked by the clamp pawl 12 as shown in FIGS. 9 and 11B. Consequently, the adapter main body D is locked to the carrier table 5 of the load port P and therefore cannot be rotated any more. In this manner, the clamp air cylinder 14 which is a locking member provided on the carrier table 5 of the load port P of the 1st cassette $K_1$ can be utilized to lock the cassette adapter A for operating the 2nd cassette $K_2$ to the carrier table 5.

Then, if the carrier table 5 is advanced to a position, at which carrying out and carrying in of the 2nd wafer $W_2$ in the 2nd cassette $K_2$ can be performed, by the hand of the robot in the inside of the processing tool 100, then the front end face of the cassette cover C including the paired left and right flange portions at the front end of the cassette cover C which covers the entire 2nd cassette $K_2$ closely contacts with the circumferential edge of the wafer transfer window 1a of the load port P. Consequently, even if the door plate 2 which covers the wafer transfer window 1a from the processing tool 100 side is removed to place a 2nd wafer $W_2$ into a state in which it can be transferred, the air-tightness of the portion of the wafer transfer window 1a is maintained and the degree of cleanness of air in the processing tool 100 is maintained.

Further, while the 2nd cassette $K_2$ is only set to the horizontally disposed adapter horizontal plate E in a state in which it is positioned in both of the first and second horizontal directions X and Y but is not fixed, since the entire 2nd cassette $K_2$ is covered with the cassette cover C and besides the rear opening 41 of the cassette cover C is covered with the adapter vertical plate B in an uprightly erected posture, there is no possibility that a hand of a person may touch in error with the 2nd cassette $K_2$ to displace the 2nd cassette $K_2$ from the set position. Further, since the adapter vertical plate B is configured from a transparent member, a state of carrying out and carrying in of the 2nd wafer can be visually observed through the adapter vertical plate B. Therefore, if some failure regarding carrying out and carrying in of the 2nd wafer occurs, then it can be found immediately by the user.

It is to be noted that, after the 2nd wafers $W_2$ after the processing are placed back into the wafer insertion grooves 114 of the 2nd cassette $K_2$, the adapter main body D is pivotally moved by 90°−θ toward the outside of the cassette cover C (refer to FIGS. 6 and 7), and, in this state, the 2nd cassette $K_2$ is taken out from the adapter main body D and then carried to a next step.

While a preferred embodiment of the present invention has been described using specific terms, such description is for illustrative purpose only, and it is to be understood that changes and variations may be made without departing from the spirit or scope of the following claims.

What is claimed is:

1. A cassette adapter adapted to be mounted on a load port that receives a first cassette to accommodate a first wafer of a first size therein, the cassette adapter comprising:

an adapter base configured to be secured to the load port, the load port receiving the first cassette that accommodates the first wafer of the first size, the load port including a locking member that releasably locks the first cassette thereon;

an adapter body pivotally supported on the adapter base and configured to pivot around a pivot axis between a first position and a second position, the adapter body including:

a first adapter plate on which a second cassette that accommodates a second wafer of a second size different from the first size is placed when the adapter body is at the first position where the second wafer is approximately vertically positioned in the second cassette, a second adapter plate on which the second cassette is placed when the adapter body is at the second position where the second wafer is substantially horizontally positioned in the second cassette, and a locking target member provided on the second adapter plate and configured to be releasably locked by the locking member of the load port when the adapter body is at the second position; and a sensor that detects when the second cassette is set in a correct position on the second adapter plate.

2. The cassette adapter according to claim 1, wherein:

the adapter body is configured to pivot at an angle of 90°−θ with respect to the adapter base, the first adapter plate is inclined with respect to a horizontal plane at an angle of θ when the adapter body is at the first position; and the second adapter plate and the second wafer in the second cassette are substantially horizontal when the adapter body is at the second position.

3. The cassette adapter according to claim 1, further comprising:

a cassette cover configured to be attached to the second adapter plate and to cover the second cassette placed on the second adapter plate, wherein the cassette cover has a front side opening and a rear side opening, a length of the rear side opening being vertically longer than a length of the front side opening, and the first adapter plate substantially closes the rear side opening when the adapter body is at the second position.

4. The cassette adapter according to claim 3, wherein:

the cassette cover is made of a substantially transparent material.

5. The cassette adapter according to claim 1, wherein the load port has second sensor that detects when the first cassette is set in a correct position on the load port, and the adapter body further includes:

a sensor actuation member provided on the second adapter plate and configured to actuate the second sensor, the second sensor detecting when the adapter body is at the second position.

6. The cassette adapter according to claim 5, wherein:

the second sensor is of a plurality of sensors and a first one of the plurality of sensors is actuated by the sensor actuation member.

7. The cassette adapter according to claim 6, wherein:

the first one of the plurality of sensors is disposed at a position furthest from the pivot axis among the plurality of sensors.

8. The cassette adapter according to claim 6, wherein:

the adapter body further includes a stopper member that sets the second adapter plate horizontally.

9. The cassette adapter according to claim 6, wherein:
the stopper member includes a pair of stoppers disposed at a predetermined distance from the pivot axis.

10. The cassette adapter according to claim 1, wherein
the locking member includes a rod that includes a clamp pawl attached to an end thereof,
the locking member performs back and forth movement and pivotal motion, and
the clamp pawl on the locking member engages with the locking target member on the second adapter plate.

* * * * *